(12) United States Patent
Chang

(10) Patent No.: US 10,451,983 B2
(45) Date of Patent: Oct. 22, 2019

(54) EXPOSURE APPARATUS AND METHOD OF FABRICATING SEMICONDUCTOR DEVICE USING THE SAME

(71) Applicant: SAMSUNG ELECTRONICS CO., LTD., Suwon-si, Gyeonggi-do (KR)

(72) Inventor: Chan Sam Chang, Seoul (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/122,315

(22) Filed: Sep. 5, 2018

(65) Prior Publication Data

US 2019/0265600 A1   Aug. 29, 2019

(30) Foreign Application Priority Data

Feb. 23, 2018 (KR) .................. 10-2018-0022043

(51) Int. Cl.
*G03B 27/52* (2006.01)
*G03F 7/20* (2006.01)

(52) U.S. Cl.
CPC .......... *G03F 7/70875* (2013.01); *G03F 7/705* (2013.01); *G03F 7/7005* (2013.01); *G03F 7/70283* (2013.01)

(58) Field of Classification Search
CPC .... G03F 7/70875; G03F 7/7015; G03F 7/708; G03F 7/70858; G03F 7/70866; G03F 7/70908; G03F 7/70941; G03F 7/70008; G03F 7/70016; G03F 7/70025; G03F 7/7005; G03F 7/70283; G03F 7/70325; G03F 7/70466; G03F 7/705; G03F 7/7095; H01L 21/0274

USPC ......... 355/30, 52, 53, 55, 67–77; 250/492.1, 250/492.2, 492.22, 493.1, 494.1, 495.1, 250/503.1, 504 R, 492.23; 430/330, 394, 430/944; 438/795, 799; 219/216

See application file for complete search history.

(56) References Cited

U.S. PATENT DOCUMENTS

| | | | |
|---|---|---|---|
| 6,342,941 B1 * | 1/2002 | Nei | G03F 7/70433 355/52 |
| 6,607,991 B1 | 8/2003 | Livesay et al. | |
| 6,613,487 B1 | 9/2003 | Kim et al. | |
| 6,646,274 B1 * | 11/2003 | Bleeker | B82Y 10/00 250/492.2 |
| 8,562,891 B2 | 10/2013 | Cho et al. | |
| 9,176,399 B2 | 11/2015 | Chung | |
| 2005/0136346 A1 * | 6/2005 | Ottens | G03F 7/70616 430/30 |
| 2005/0213067 A1 * | 9/2005 | Van Der Feltz | G03F 7/705 355/67 |

(Continued)

FOREIGN PATENT DOCUMENTS

| | | |
|---|---|---|
| JP | 10-242020 A | 9/1998 |
| KR | 10-2009-0044579 A | 5/2009 |
| KR | 10-2013-0022676 A | 3/2013 |

*Primary Examiner* — Christina A Riddle
(74) *Attorney, Agent, or Firm* — Lee & Morse, P.C.

(57) ABSTRACT

An exposure apparatus is provided. The exposure apparatus includes a stage for a wafer, a first light source generating a first light beam, an exposure optical system to receive the first light beam and to direct the first light beam as an exposure light beam onto an exposure area in a field of the wafer, and a heating unit including a second light source, which generates second light, and heating the exposure area by applying the second light to the exposure area.

20 Claims, 14 Drawing Sheets

(56) References Cited

U.S. PATENT DOCUMENTS

| | | | |
|---|---|---|---|
| 2006/0033898 A1* | 2/2006 | Cadee | G03F 7/70341 355/53 |
| 2010/0230864 A1 | 9/2010 | Park et al. | |
| 2013/0093113 A1* | 4/2013 | Hayashi | G03F 7/0002 264/40.1 |
| 2016/0252828 A1 | 9/2016 | Kobayashi et al. | |
| 2017/0115578 A1* | 4/2017 | Berendsen | G03F 7/70033 |

* cited by examiner

EXPOSURE APPARATUS AND METHOD OF FABRICATING SEMICONDUCTOR DEVICE USING THE SAME

CROSS-REFERENCE TO RELATED APPLICATION

Korean Patent Application No. 10-2018-0022043, filed on Feb. 23, 2018, in the Korean Intellectual Property Office, and entitled: "Exposure Apparatus and Method of Fabricating Semiconductor Device Using the Same," is incorporated by reference herein in its entirety.

BACKGROUND

1. Field

The present disclosure relates to an exposure apparatus and a method of fabricating a semiconductor device using the same.

2. Description of the Related Art

Semiconductor elements are currently able to operate at high speed at a low voltage. Processes of manufacturing semiconductor elements have been developed to increase the integration density of semiconductor elements. Thus, highly-scaled, highly-integrated semiconductor element patterns can be formed to have a fine width and to be spaced at a fine pitch. Maintaining alignment during multiple exposure processes for forming a single semiconductor element is an important factor affecting the pattern precision of semiconductor fabrication.

SUMMARY

According to some example embodiments of the present disclosure, an exposure apparatus includes: a stage loading a wafer; a first light source to generate a first light beam; an exposure optical system to receive the first light beam and to direct the first light beam as an exposure light beam onto an exposure area in a field of the wafer; and a heating unit including a second light source to generate a second light beam to be directed onto the exposure area to heat the exposure area.

According to some example embodiments of the present disclosure, an exposure apparatus includes: a stage to receive a wafer; an exposure optical system to apply exposure light to an exposure area in a field of the wafer based on first light of a first wavelength; and a heating unit applying heating light to the field based on second light of a second wavelength, which is longer than the first wavelength.

According to some example embodiments of the present disclosure, a method of fabricating a semiconductor device, includes: loading a wafer on a wafer stage; directing exposure light having a first wavelength to an exposure area in a field of a wafer; and applying heating light having a second wavelength, different from the first wavelength, to the exposure area.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
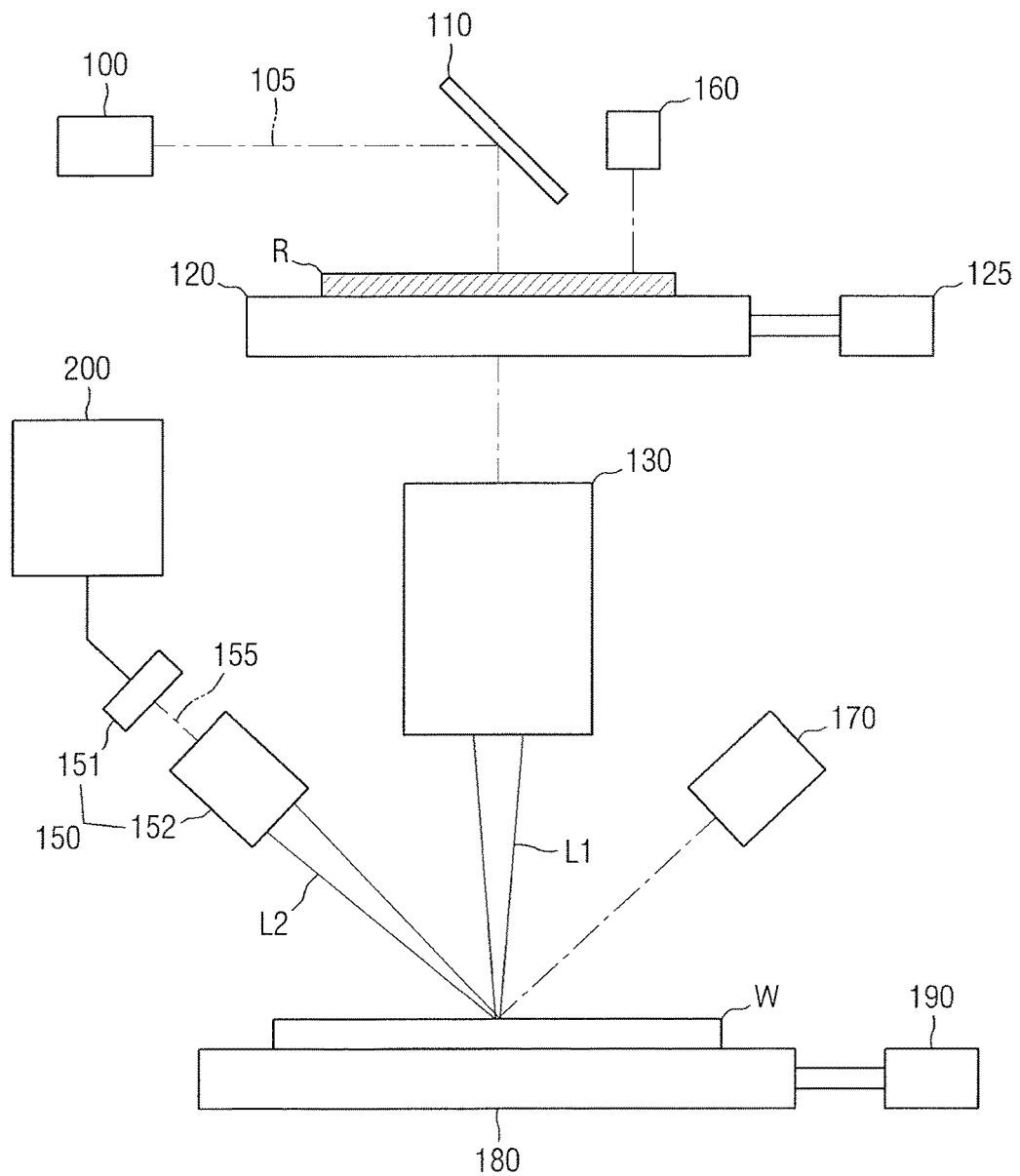
FIG. 1 illustrates a schematic view of an exposure apparatus according to some example embodiments of the present disclosure.

FIG. 1 is a schematic view of an exposure apparatus according to some example embodiments of the present disclosure. Referring to FIG. 1, the exposure apparatus according to some example embodiments of the present disclosure may include a first light source 100, a reflective surface 110, a reticle stage 120, a reticle stage driving unit 125, an exposure optical system 130, a heating unit 150, an alignment sensor 160, a level sensor 170, a wafer stage 180, a wafer stage driving unit 190, and a heating unit controller 200.

The first light source 100 may generate a first light beam 105 for performing exposure on a wafer W. In some example embodiments, the first light source 100 may be an excimer laser that emits deep ultraviolet light. e.g., an argon fluoride (ArF) light source that emits the first light beam 105 with a wavelength of 193 nm. Alternatively, the first light source 100 may be an extreme ultraviolet (EUV) light source that emits the first light beam 105 with a wavelength of 13.5 nm.

The reflective surface 110 may change the optical path of the first light beam 105 to direct the first light beam 105 onto a reticle R. FIG. 1 illustrates an example in which a single reflective surface 110 is provided. Alternatively, a plurality of reflective surfaces 110 may be provided, a plurality of reflective surfaces and a plurality of lenses transmitting light therethrough may both be provided, a reflective surface(s) having optical power maybe provided, and so forth, to direct the first light beam 105 onto the reticle R.

The first light beam 105 incident on the reflective surface 110 may be reflected therefrom onto a first surface of the reticle R. The reticle R may include a pattern region on the first surface thereof. The pattern region may block some of the first light beam 105 provided from the reflective surface 110 to the reticle R. The rest of the first light beam 105 that is not blocked by the pattern region may be incident upon the exposure optical system 130.

In some example embodiments, the reticle R may be a reticle for positive tone development (PTD). The reticle R for PTD may have a transmittance of about 10% to 30%. That is, 70% to 90% of the energy of the first light beam 105 may be blocked by the reticle R, and 10% to 30% of the energy of the first light beam 105 may be provided to the exposure optical system 130. The reticle R for PTD may be used in an exposure process for fabricating a lower layer of a semiconductor device. The lower layer may be formed by a line-and-space process for forming, e.g., an active region or gates.

Alternatively, the reticle R may be a reticle for negative tone development (NTD). In this case, the reticle R for NTD may have a transmittance of about 70% to 80%. That is, 20% to 30% of the energy of the first light beam 105 may be blocked by the reticle R, and 70% to 80% of the energy of the first light beam 105 may be provided to the exposure optical system 130. The reticle R for NTD may be used in an exposure process for fabricating an upper layer of a semiconductor device. The upper layer may be formed by a process for forming, e.g., contacts.

In an exposure process that requires extreme precision, the alignment between a reticle and a wafer is maintained using alignment marks formed on the wafer and the reticle. However, if exposure is performed using different reticles, e.g., reticles having different transmittances, problems may arise in connection with the alignment. Also, during exposure, reticles, an exposure optical system, and a wafer may all absorb thermal energy and, thus, thermally expand. As a result, misalignment may occur.

In particular, the thermal energy of exposure light provided to a wafer during a first exposure process using a reticle for PTD may differ from the thermal energy of exposure light provided to the wafer during a second exposure process using a reticle for NTD. That is, since the reticle for NTD has a higher transmittance than the reticle for PTD, the amount of thermal energy received by the wafer during the second exposure process may be greater than the amount of thermal energy received by the wafer during the first exposure process.

For example, a silicon wafer thermally expands due to the thermal energy provided by exposure light. The degree to which the silicon wafer expands during exposure may differ from the first exposure process to the second exposure process, as different amounts of thermal energy are provided during the first and second exposure processes. The difference in the degree of expansion of the wafer may cause reticle misalignment between the first and second exposure processes.

The exposure apparatus of FIG. 1 includes the heating unit 150, which applies heat to the wafer W, and can thus compensate for the degree of thermal expansion of the wafer W. A wafer heating operation performed by the heating unit 150 will be described later.

The reticle R may be supported by the reticle stage 120. The reticle stage 120 not only supports the reticle R relative to the exposure optical system 130, but may also move the reticle R in horizontal directions (e.g., direction orthogonal to the upper surface of the reticle R, in the case of FIG. 1, in a left-to-right direction or a back-and-forth direction) with the aid of the reticle stage driving unit 125.

The exposure optical system 130 may receive the first light beam 105 through the reticle R and may generate an exposure light beam L1 to be provided to the wafer W. The exposure optical system 130 may include, e.g., a plurality of lenses or mirrors and a body tube surrounding the lenses or the mirrors.

The exposure optical system 130 may be adjacent the wafer W, e.g., between the reticle and the wafer W along an optical path. FIG. 1 illustrates the exposure optical system 130 as overlapping the wafer W in a vertical direction, but the present disclosure is not limited thereto. The exposure optical system 130 may provide the exposure light beam L1 to the wafer W while not overlapping with the wafer W in the vertical direction. For example, one or more reflective surfaces may direct the exposure light beam L1 onto the wafer W.

The exposure apparatus of FIG. 1 may perform exposure in a scanning manner. Thus, the exposure apparatus of FIG. 1 may apply the exposure light beam L1 to an exposure area, which is defined as part of an exposure target. i.e., the wafer W, within a field, and may then perform exposure on the entire field by moving the wafer stage 180 so as to move the exposure area within the field. When exposure is performed in a scanning manner, the exposure optical system 130 may be fixed, and the relative location of the wafer W to the exposure optical system 130 may be changed by moving only the wafer stage 180. Alternatively or additionally, other components may be moved relative to the wafer stage 180. Exposure performed by the exposure apparatus of FIG. 1 will be described later in further detail.

In order for the exposure optical system 130 to output the exposure light beam L1 for use in scanning-type exposure, a slit may be at the output end of the exposure optical system 130. The exposure optical system 130 may output linear exposure light L1, which is to be applied to an exposure area EA1 of FIG. 2, through the slit.

The heating unit 150 may be adjacent the wafer W. The heating unit 150 may include a second light source 151 and an optical system 152. The heating unit 150 may provide a heating light beam L2 to the wafer W that heats a portion of the wafer W on which the heating light beam L2 is incident.

The second light source 151 may output a longer wavelength than the first light source 100, e.g., near ultraviolet (UV) light, visible light, infrared light, and so forth, and may generate a second light beam 155 having a different wavelength from the first light beam 105. For example, the second light source 151 may include a laser generating the second light beam 155 having a wavelength of 425 nm to 800 nm. The second light beam 155 generated by the second light source 151 may be pulsed laser light or continuous wave (CW) laser light.

The second light beam 155 generated by the second light source 151 may be applied to the wafer W through the optical system 152 as the heating light beam L2. The optical system 152 may include, e.g., a plurality of lenses or mirrors and a body tube surrounding the lenses or the mirrors.

The optical system 152 may receive the second light beam 155 generated by the second light source 151 and may output the heating light beam L2 to be incident on the wafer W. The heating unit 150 may output a linear heating light beam L2 to be applied to the exposure area EA1 of FIG. 2, e.g., the optical system 152 may include a slit in order to provide the heating light beam L2 that is linear like the exposure light beam L1. The operations of the exposure optical system 130 and the heating unit 150 will hereinafter be described with reference to FIG. 2.

Figure 2:
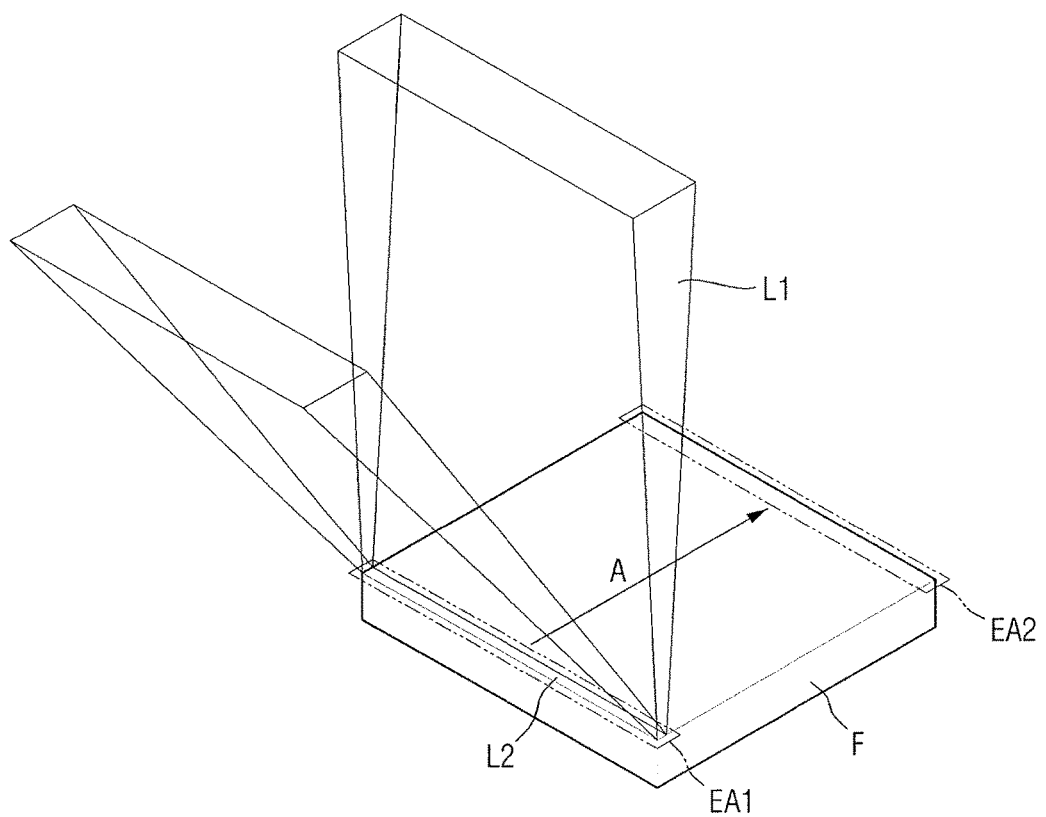
FIG. 2 illustrates a schematic view for explaining the operation of a heating unit of the exposure apparatus of FIG. 1.

FIG. 2 is a schematic view for explaining the operation of the heating unit 150 of the exposure apparatus of FIG. 1. Referring to FIG. 2, the exposure light beam L1 and the heating light beam L2 may be applied to a field F of a wafer W, which is an exposure target. The exposure optical system 130 and the heating unit 150, which apply the exposure light beam L1 and the heating light beam L2, respectively, are not illustrated in FIG. 2, for clarity. The field F may be the unit in which exposure is to be performed on the wafer W, e.g., a subset of the entirety of the wafer W. For example, the field F may be formed by a single die, a plurality of dies, and so forth.

The exposure light beam L1 passing through the slit of the exposure optical system 130 is applied to the exposure area EA1 of the field F. Similarly, the heating light beam L2 passing through the optical system 152 is applied to the exposure area EA1 of the field F. As illustrated in FIG. 2, the exposure area EA1 may be defined as extending in the width direction of the field F, and the exposure light beam L1 and the heating light beam L2 may both be incident on the field F in the form of light elongated in the width direction of the field F, e.g., linear light. However, the exposure light beam L1 and the heating light beam L2 may be at different angles relative to an upper surface of the exposure area EA1. For example, the exposure light beam L1 may by orthogonal to the upper surface of the exposure area EA1, while the heating light beam L2 may be at oblique angle to the upper surface of the exposure area EA1.

Since the exposure light beam L1 is provided by the exposure optical system 130 to the field F, the surface temperature of the exposure area EA1 may increase. Also, since the heating light L2 is provided by the heating unit 150 to the field F, the surface temperature of the exposure area EA1 may additionally increase. The heating unit 150 may raise the surface temperature of the exposure area EA1 using the heating light beam L2. Thus, the heating unit 150 and the exposure optical system 130 may provide the heating light beam L2 and the exposure light beam L1, respectively, to the exposure area EA1 at the same time, thereby raising the surface temperature of the exposure area EA1.

As mentioned above, the exposure apparatus of FIG. 1 performs exposure in a scanning manner. Thus, exposure may be performed by moving the exposure area EA1 around in a direction A within the field F. The direction A may be the longitudinal direction of the field F, e.g., orthogonal to the linear extension of the heating light beam L2 and the exposure light beam L1.

Heating of the field F may also be performed in the direction A. The moving of the exposure area EA1 may mean moving of the wafer stage 180 with the use of the wafer stage driving unit 190, while the exposure optical system 130 or the heating unit 150 remain stationary. The wafer stage driving unit 190 may move the wafer stage 180 in the opposite direction to the direction A.

Referring again to FIG. 1, the heating unit 150 may be controlled by the heating unit controller 200. The heating unit controller 200 may control the dose of the heating light beam L2 provided by the heating unit 150, e.g., by controlling the pulse frequency and/or period of light generated by the second light source 152. This will be described later with reference to FIG. 5.

The alignment sensor 160 and the level sensor 170 may be further included in the exposure apparatus of FIG. 1. The alignment sensor 160 may determine whether an alignment mark on the reticle R and an alignment mark on the wafer W are aligned with each other. The exposure apparatus of FIG. 1 may move the wafer stage 180 and/or the reticle stage 120 based on the result of the sensing performed by the alignment sensor 160 as to whether the wafer W and the reticle R are aligned. The level sensor 170 may detect the amount of exposure performed by the exposure apparatus of FIG. 1 by measuring the thickness of a photoresist film formed on the surface of the wafer W.

The wafer W may be loaded onto the wafer stage 180. The wafer stage 180 may be moved horizontally by the wafer stage driving unit 190. When exposure is being performed, the wafer stage 180 may continue to be moved by the wafer stage driving unit 190. The moving path of the wafer stage 180 is apparent from the moving path of the exposure area EA1, as illustrated in FIG. 3A.

Figure 3A:
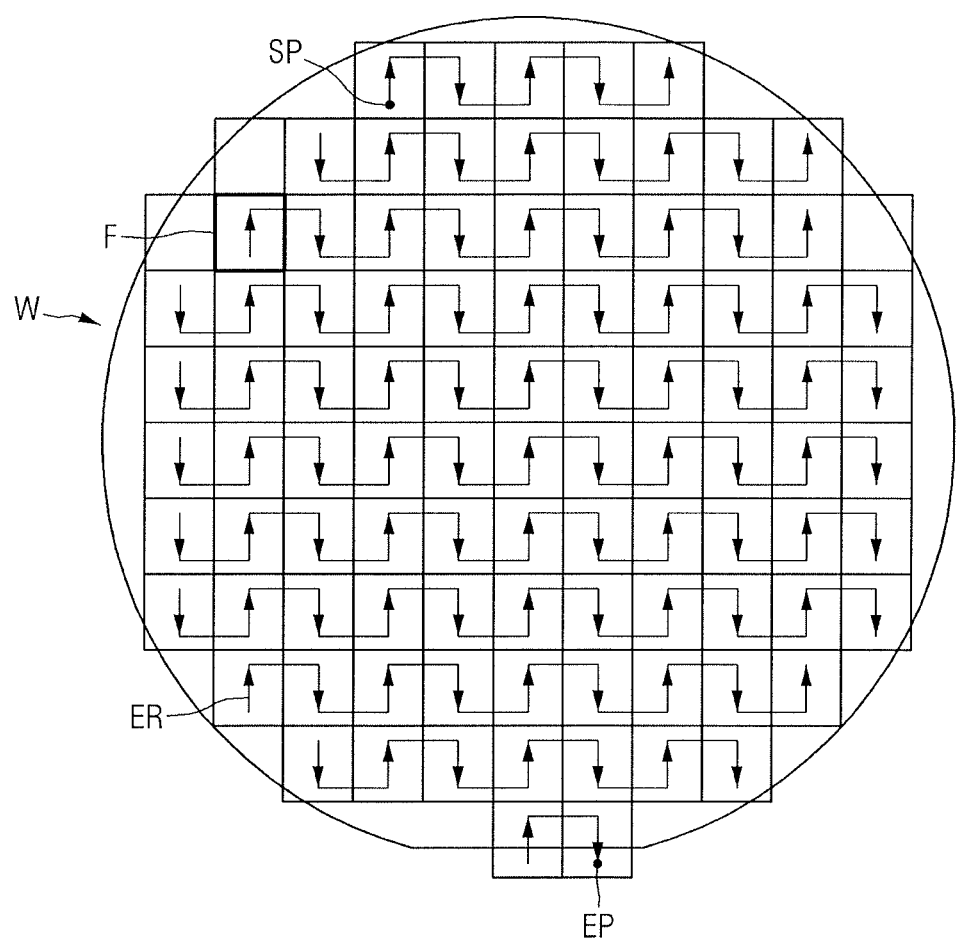
FIG. 3A illustrates a schematic view for explaining a scanning-type exposure process performed by the exposure apparatus of FIG. 1.

FIG. 3A is a schematic view for explaining a scanning-type exposure process performed by the exposure apparatus of FIG. 1. Referring to FIG. 3A, exposure may be performed on a plurality of fields F defined on the wafer W. Specifically, exposure may be performed starting from a first field F at the top of the wafer W, e.g., from a starting point SP in the first field F. Scanning that starts from the starting point SP may be continued by moving in one direction within the first field F. Then, once the end of the first field F is reached, scanning may be reassumed by moving over to a second field F next to the first field F.

An exposure route ER of exposure performed by continuously scanning the plurality of fields F defined on the wafer W of FIG. 3A is indicated by arrows. The exposure route ER ends at an end point EP.

Figure 3B:
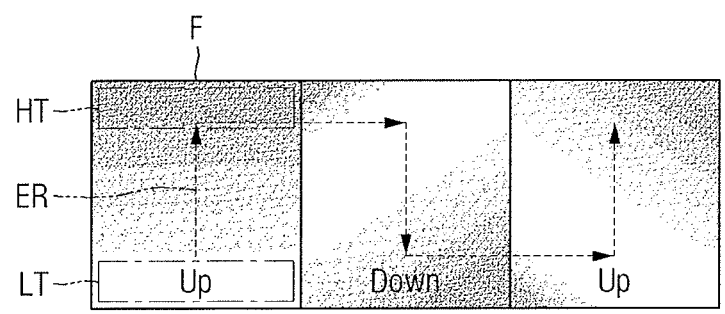
FIG. 3B illustrates a schematic view showing the distribution of heat on a wafer, generated by the scanning-type exposure process of FIG. 3A.

FIG. 3B is a schematic view showing the distribution of heat on a wafer, generated by the scanning-type exposure process of FIG. 3A. Referring to FIG. 3B, an exposure route ER shows that exposure is performed in an upward direction, in a downward direction, and then in the upward direction across three consecutive fields F. The degree to which each field F is heated by the exposure light beam L1 during exposure may vary from one location to another location, even within the same field F, and as shown in FIG. 3B, the closer to the end of the exposure route ER, the higher the temperature.

Referring to FIG. 3B, a low-temperature area LT corresponds to the starting point of scanning, and a high-temperature area HT corresponds to the end point of scanning. In FIG. 3B, which shows the distribution of the temperature on the wafer W that continually varies, even within the same field F, areas with dark shades represent areas having a relatively high surface temperature, and areas with lighter shades represent areas having a relatively low surface temperature.

Measurements of the surface temperature of the wafer W may be obtained using a temperature sensor in the process of performing exposure on the wafer W. Alternatively, the temperature distribution model shown in FIG. 3B may be obtained by thermomechanical modeling-based simulation of the wafer W.

Figure 4:
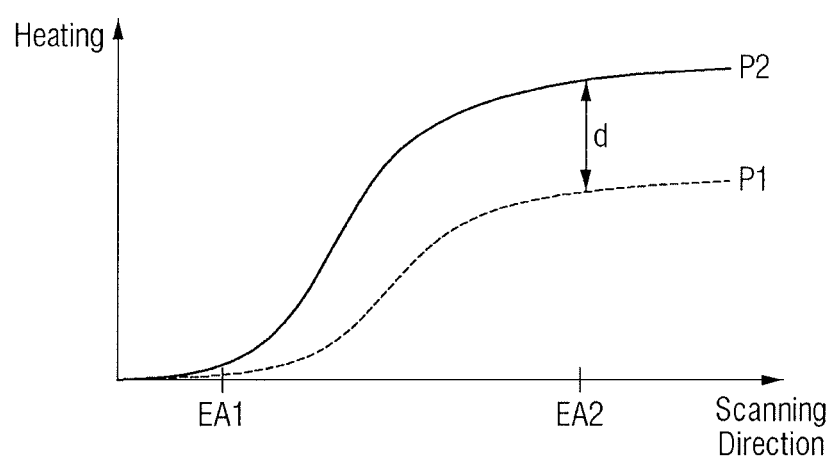
FIG. 4 illustrates a graph for explaining differences in the amount of heat generated between different exposure processes performed by the exposure device of FIG. 1.

FIG. 4 is a graph for explaining differences in the amount of heat generated between different exposure processes performed by the exposure device of FIG. 1. When exposure is performed for two or more layers, differences in the amount of energy received by each field F of a wafer W may be compensated.

Specifically, referring to FIG. 4, a curve P1 represents the variation of the temperature in each field F in accordance with a scanning direction when a first exposure process using a first reticle is performed, and exposure areas EA1 and EA2 indicate the starting point and the end point, respectively, of exposure performed on each field F. The first reticle may be, e.g., a reticle for PTD.

A curve P2 represents the variation of temperature in each field F in accordance with a scanning direction when a second exposure process using a second reticle is performed. The second reticle may have a higher transmittance than the first reticle and may be, e.g., a reticle for NTD.

The difference in the amount of energy received by the same location in each field F between the first and second exposure processes may be indicated by a temperature difference d between the curves P1 and P2. If the amount of energy received by the same location in each field F differs from the first exposure process to the second exposure process, the degree of expansion of the wafer W may also differ from the first exposure process to the second exposure process. This may affect the alignment of the second reticle during the second exposure process.

Thus, in order to compensate for the difference in the amount of energy received by the same location in each field F between the first and second exposure processes, a heating process may be performed by the heating unit 150. Specifically, if the amount of energy received by a first location in a field F differs greatly from the first exposure process to the second exposure process, such that alignment or overlay error between the first and second layers is off by a predetermined amount or greater, the heating unit 150 may compensate for the difference in the amount of energy received by the first location between the first and second exposure processes by heating the first location of the field F on the wafer W. On the other hand, if the difference in the amount of energy received by a second location in the field F between the first and second exposure processes is relatively small, such that alignment or overlay error between the first and second layers is off by less than the predetermined amount, the heating unit 150 may compensate for the difference in the amount of energy received by the second location between the first and second exposure processes by heating the second location with a relatively small energy as compared with heating the first location. Thus, the wafer W may, after heating, have a relatively uniform thermal profile. The predetermined amount may be set based on a design constraints of the pattern to be formed on the wafer W.

Figure 5:
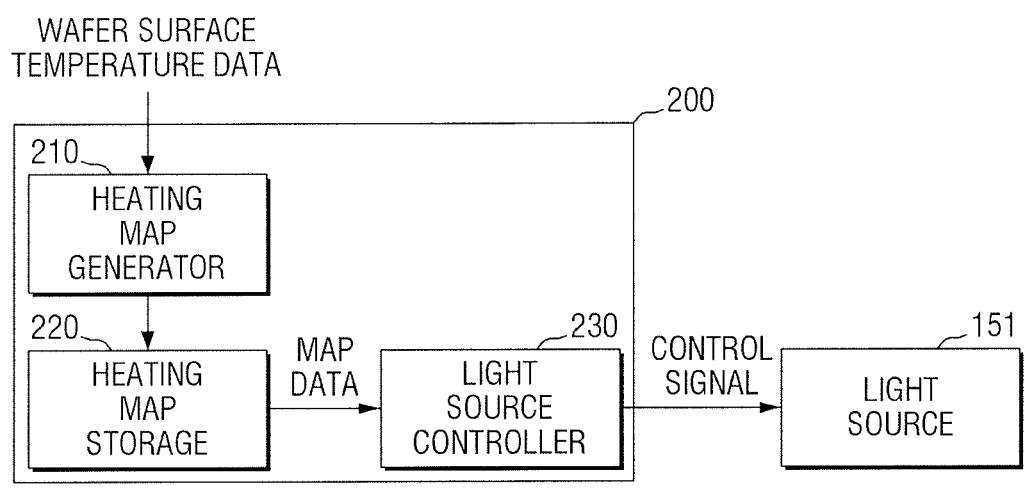
FIG. 5 illustrates a block diagram of a heating unit controller of the exposure apparatus of FIG. 1.

FIG. 5 is a block diagram of the heating unit controller of the exposure apparatus of FIG. 1. Referring to FIG. 5, the heating unit controller 200 may include a heating map generator 210, a heating map storage 220, and a light source controller 230.

The heating unit controller 200 may receive wafer surface temperature data, i.e., data regarding the surface temperature of the wafer W during exposure, and may generate a heating map of the wafer W based on the wafer surface temperature data. The heating map of the wafer W may be defined as a map showing energies in the wafer W that need to be compensated for by the heating unit 150 during exposure using different reticles.

Specifically, the heating map generator 210 may receive data regarding the surface temperature of the wafer W during the first exposure process using the first reticle and data regarding the surface temperature of the wafer during the second exposure process using the second reticle. The data received by the heating map generator 210 may be provided by an external temperature sensor.

The heating map generator 210 may generate a heating map based on differences in the surface temperature of the wafer W between the first exposure process using the first reticle and the second exposure process using the second reticle. The differences in the surface temperature of the wafer W between the first exposure process using the first reticle and the second exposure process using the second reticle may be as illustrated in FIG. 6.

Figure 6:
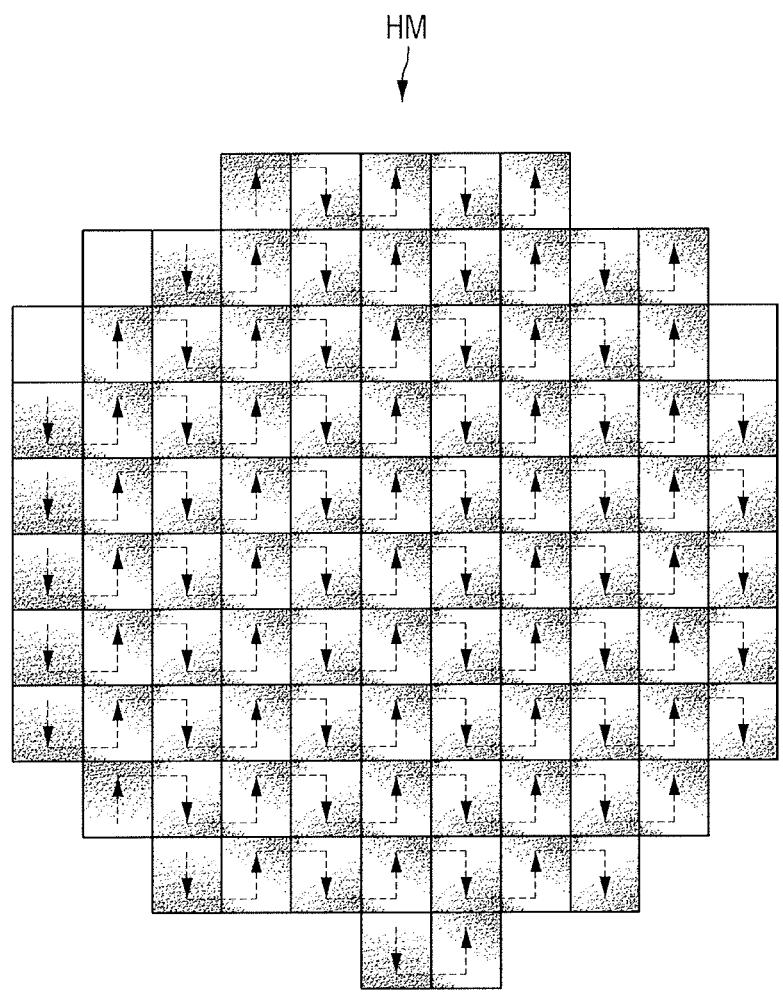
FIG. 6 illustrates a schematic view for explaining the distribution of heat on a wafer during exposure performed by the exposure apparatus of FIG. 1.

FIG. 6 is a schematic view for explaining the distribution of heat on a wafer during exposure performed by the exposure apparatus of FIG. 1. Specifically, FIG. 6 shows the distribution of heat on the wafer W based on the data regarding the surface temperature of the wafer W during the first exposure process using the first reticle and the data regarding the surface temperature of the wafer during the second exposure process using the second reticle. The data shown in FIG. 6 may be data generated by the differences in the surface temperature of the wafer W between the first exposure process using the first reticle and the second exposure process using the second reticle.

In FIG. 6, areas with dark shades represent areas having a relatively large difference in the surface temperature of the wafer W between the first and second exposure processes, and areas with lighter shades represent areas having a relatively small difference in the surface temperature of the wafer W between the first and second exposure processes. The heating map generator 210 may generate a heating map for controlling the heating unit 150 based on the data regarding the surface temperature of the wafer W during the first exposure process using the first reticle and the data regarding the surface temperature of the wafer during the second exposure process using the second reticle.

Figure 7A:
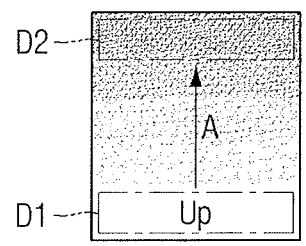
FIGS. 7A and 7B illustrate schematic views for explaining a heating map generated by the heating unit controller of FIG. 5.
Figure 7B:
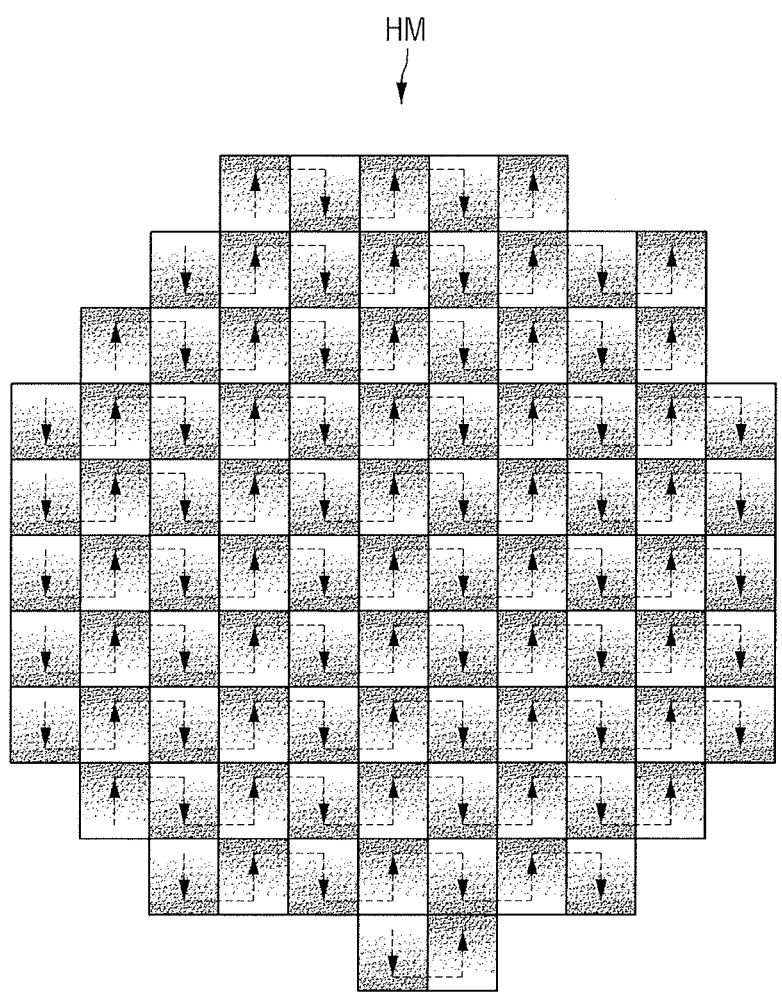

FIGS. 7A and 7B are schematic views for explaining a heating map generated by the heating unit controller of FIG. 5. Referring to FIGS. 7A and 7B, the heating map generator 210 may generate a heating map HM. Specifically, FIG. 7A shows a heating map HM for a single field. As mentioned above, it is assumed that the differences in the surface temperature of the wafer W between the first and second exposure processes increase along a scanning direction. The heating map HM may be data indicating the amount of energy applied by the heating unit 150 to each field F to compensate for the differences in the surface temperature of the wafer W between the first and second exposure processes.

For example, in the heating map HM of FIG. 7A, an area D1 with a relatively light shade corresponds to an area with a relatively small difference in the temperature of the wafer W between the first and second exposure processes and may thus be provided with a relatively small energy by the heating unit 150. On the other hand, an area D2 with a relatively dark shade corresponds to an area with a relatively large difference in the temperature of the wafer W between the first and second exposure processes and may thus be provided with a relatively large energy by the heating unit 150.

FIG. 7B shows a heating map HM for a plurality of fields F and also shows an exposure route ER. The exposure apparatus of FIG. 1 may perform exposure on each of the plurality of fields F along the exposure route ER, and at the same time, the heating unit 150 may heat each of the plurality of fields F where exposure is being performed by the exposure apparatus of FIG. 1.

The heating map generator 210 may generate the heating map HM based on the data regarding the surface temperature of the wafer W during the first exposure process using the first reticle and the data regarding the surface temperature of the wafer during the second exposure process using the second reticle. Alternatively, the light source controller 230 may use a heating map that is generated in advance and is stored in the heating map storage 220. The light source controller 230 may control the second light source 151 to generate the second light beam 155 in accordance with the heating map HM to compensate for these differences, e.g., to make the heating map more uniform after applying the heating light beam L2.

Figure 8:
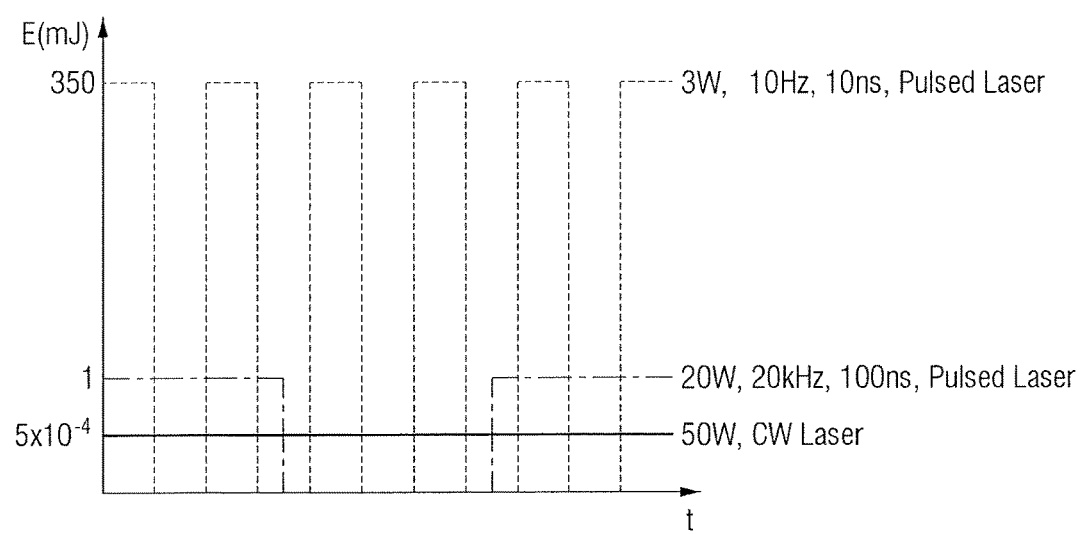
FIG. 8 illustrates a graph for explaining an operation of the heating unit of the exposure apparatus of FIG. 1.

FIG. 8 is a graph for explaining an operation of the heating unit of the exposure apparatus of FIG. 1. Referring to FIG. 8, the second light source 151 of the heating unit 150 may generate laser light in various manners. For example, the second light source 151 may generate pulsed laser light having a period of 10 Hz and lasting for 10 ns with an output of 3 W. In another example, the second light source 151 may generate pulsed laser light having a period of 20 kHz and lasting for 100 ns with an output of 20 W. In yet another example, the second light source 151 may generate continuous wave (CW) laser light with an output of 50 W.

Thus, the light source controller 230 may control the operation of the second light source 151 to change the dose of laser light generated by the second light source 151 in accordance with the heating map HM. Alternatively or additionally, the optical system 152 include an optical filter to be controlled in accordance with the heating map HM to alter an amount of the heating light beam L2 incident on regions of the fields F.

Figure 9:
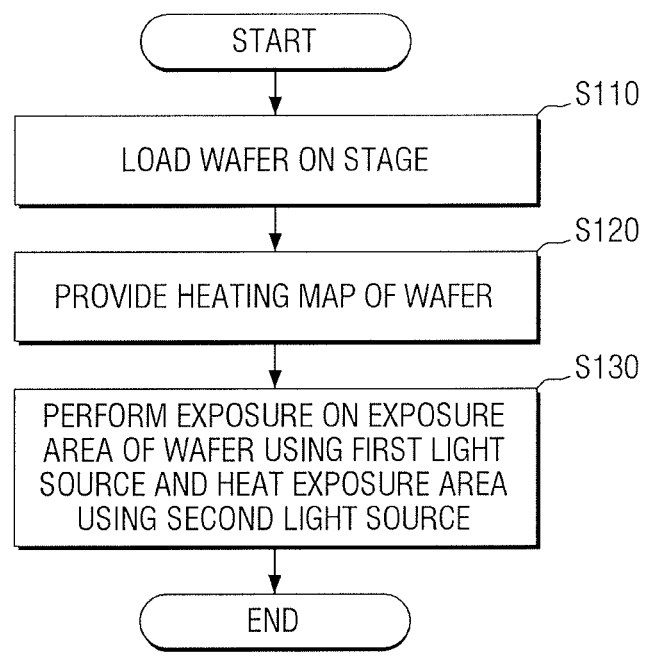
FIG. 9 illustrates a flowchart of an operation of a heating unit of an exposure apparatus according to some example embodiments of the present disclosure.

FIG. 9 is a flowchart illustrating an operation of a heating unit of an exposure apparatus according to some example embodiments of the present disclosure. Referring to FIG. 9, an exposure method of an exposure apparatus according to some example embodiments of the present disclosure may include: loading a wafer on a wafer stage (S110); providing a heating map of the wafer to a heating unit controller (S120); performing exposure on an exposure area of the wafer and a first light source, and heating the exposure area of the wafer using a second light source (S130) controlled in accordance with the heating map. The heating and exposing may be performed simultaneously, as discussed above, or sequentially, as discussed below.

Figure 10:
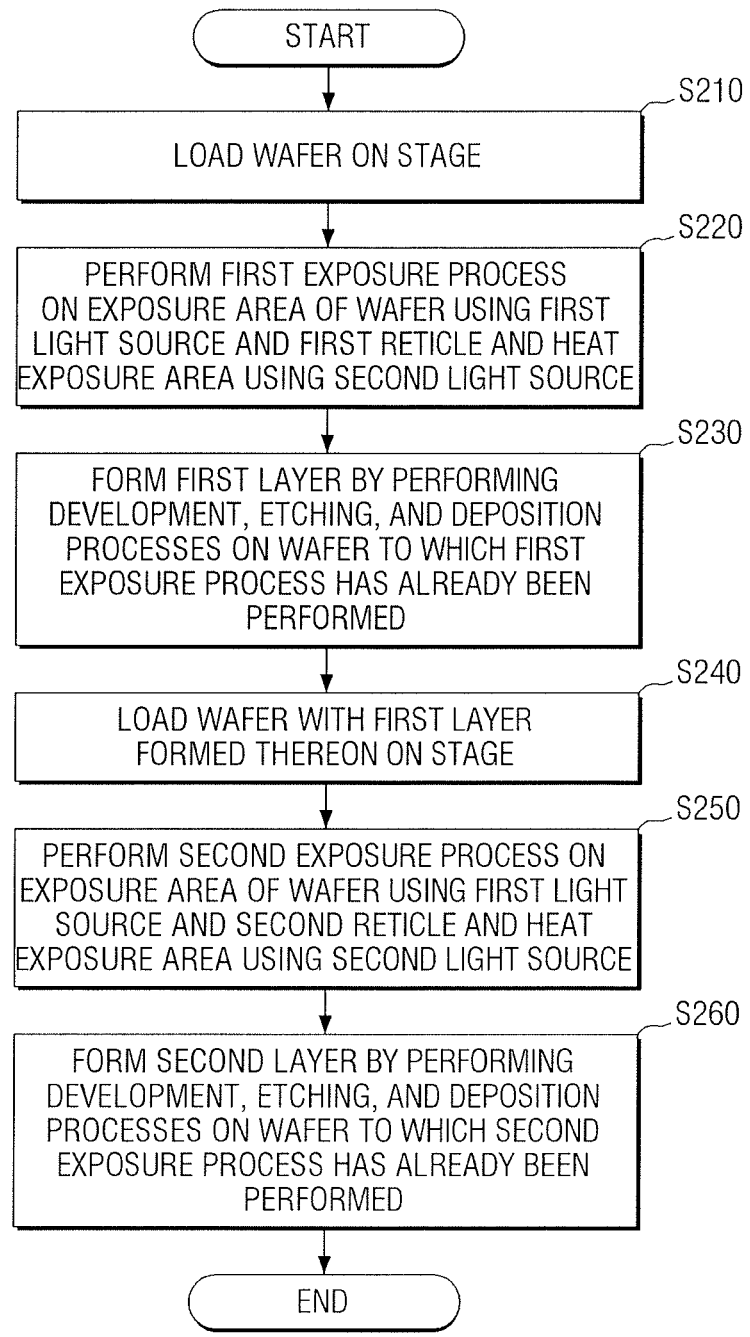
FIG. 10 illustrates a flowchart of an operation of a heating unit of an exposure apparatus according to some example embodiments of the present disclosure.

FIG. 10 is a flowchart illustrating a heating unit of an exposure apparatus according to some example embodiments of the present disclosure. Referring to FIG. 10, an exposure method of an exposure apparatus according to some example embodiments of the present disclosure may include: loading a wafer on a wafer stage (S210); performing a first exposure process on an exposure area of the wafer using a first light source and a first reticle, and heating the exposure area using a second light source (S220); forming a first layer on the wafer, e.g., by performing development, etching, and deposition processes on the wafer (S230); loading the wafer with the first layer formed thereon on the wafer stage (S240); performing a second exposure process on the exposure area of the wafer using the first light source and a second reticle, and heating the exposure area using the second light source (S250) controlled in accordance with a heating map of the wafer; and forming a second layer on the wafer, e.g., by performing development, etching, and deposition processes on the wafer (S260).

Figure 11A:
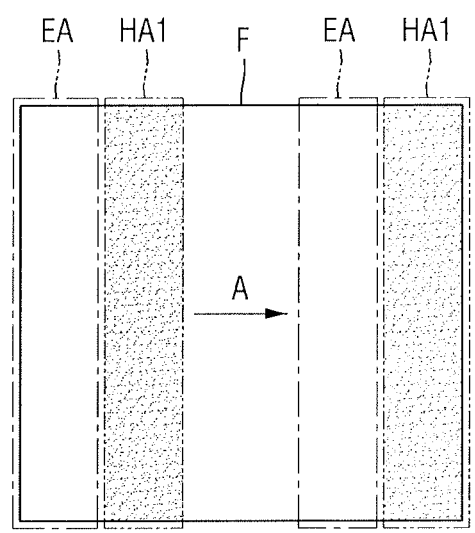
FIGS. 11A and 11B illustrate schematic views for explaining an operation of an exposure apparatus according to some example embodiments of the present disclosure.
Figure 11B:
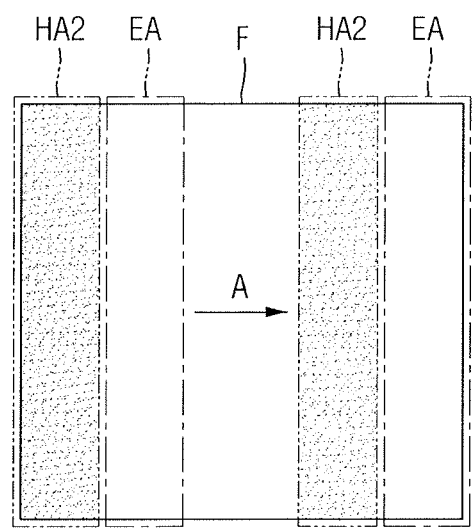

FIGS. 11A and 11B are schematic views for explaining an operation of an exposure apparatus according to some example embodiments of the present disclosure. In particular, FIGS. 11A and 11B illustrate operations in which the heating and the exposure are not performed on a same area simultaneously.

Referring to FIG. 11A, in the present example embodiment, a heating unit heats a heating area HA1, which is not a current exposure area EA, whereas in the previous example embodiments, the heating unit heats the exposure area EA. That is, the heating unit may heat part of a field F first and, then, exposure may be performed. The exposure area EA and the heating area HA1 may be arranged in series.

FIG. 11A illustrates the heating area HA1 and the exposure area EA as being moved around in a direction A by scanning.

Referring to FIG. 11B, exposure may be performed first on an exposure area EA, and then, a heating unit 150 may heat a heating area HA2. That is, the exposure unit may expose of a field F first and, then, heating may be performed. The heating area HA2 and the exposure area EA may be arranged in series. FIG. 11B illustrates the heating area HA2 and the exposure area EA as being moved around in a direction A by scanning.

Embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope of the disclosure. Further, the blocks, units and/or modules of the embodiments may be physically combined into more complex blocks, units and/or modules without departing from the scope of the disclosure.

By way of summation and review, example embodiments of the present disclosure provide an exposure apparatus and method which includes a heating unit that may be controlled in accordance with a heating map of a target, e.g., a wafer. Thus, alignment between the target and reticles having different transmittances maybe maintained during multiple exposure processes.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. An exposure apparatus, comprising:
 a stage for a wafer;
 a first light source to generate a first light beam;
 an exposure optical system to receive the first light beam and to direct the first light beam as an exposure light beam onto an exposure area in a field of the wafer;
 a heating unit including a second light source to generate a second light beam to be directed onto the exposure area to heat the exposure area; and a heating unit controller to control the heating unit based on a heating map generated based on first wafer surface temperature data obtained by performing exposure on the wafer using a first reticle and second wafer surface temperature data obtained by performing exposure on the wafer using a second reticle.

2. The exposure apparatus as claimed in claim 1, wherein the exposure optical system directs the exposure light beam onto the exposure area and the heating unit heats the exposure area simultaneously.

3. The exposure apparatus as claimed in claim 2, wherein:
the exposure optical system is to direct the exposure light beam onto the exposure area while moving the exposure area in a first direction within the field, and
the heating unit is to heat the exposure area moving in the first direction.

4. The exposure apparatus as claimed in claim 1, wherein the heating unit heats the exposure area to which the exposure light beam has already been applied by the exposure optical system.

5. The exposure apparatus as claimed in claim 1, wherein the first light beam has a different wavelength from the second light beam.

6. The exposure apparatus as claimed in claim 5, wherein the first light source is an argon fluoride light source, and the first light beam has a wavelength of 193 nm.

7. The exposure apparatus as claimed in claim 5, wherein the second light beam has a wavelength of 425 nm to 800 nm.

8. The exposure apparatus as claimed in claim 7, wherein the exposure optical system includes a slit that outputs the exposure light beam as a linear light beam.

9. The exposure apparatus as claimed in claim 1, wherein the first reticle has a lower transmittance than the second reticle.

10. The exposure apparatus as claimed in claim 1, wherein the heating unit heats the exposure area when exposure is being performed on the wafer using the first reticle.

11. An exposure apparatus, comprising:
a stage to receive a wafer;
an exposure optical system to apply exposure light to an exposure area in a field of the wafer based on first light of a first wavelength;
a heating unit applying heating light to the field based on second light of a second wavelength, which is longer than the first wavelength; and
a heating unit controller to control the heating unit, wherein the heating unit controller is to:
generate a heating map based on first wafer surface temperature data obtained by performing exposure on the wafer using a first reticle and second wafer surface temperature data obtained by performing exposure on the wafer using a second reticle, and
control the heating unit based on the heating map.

12. The exposure apparatus as claimed in claim 11, wherein the exposure optical system applies the exposure light to the exposure area, and at the same time, the heating unit applies the heating light to the exposure area.

13. The exposure apparatus as claimed in claim 12, wherein:
the exposure optical system applies the exposure light while moving the exposure area in a first direction within the field, and
the heating unit applies the heating light along with the exposure light.

14. The exposure apparatus as claimed in claim 11, wherein the first reticle has a lower transmittance than the second reticle.

15. The exposure apparatus as claimed in claim 11, wherein the heating unit is to heat the exposure area when exposure is being performed on the wafer using the first reticle.

16. A method of fabricating a semiconductor device, comprising:
loading a wafer on a wafer stage;
directing exposure light having a first wavelength to an exposure area in a field of a wafer; and
applying heating light having a second wavelength, different from the first wavelength, to the exposure area, applying heating light including controlling a dose of heating light in accordance with a heating map based on first wafer surface temperature data obtained by performing exposure on the wafer using a first reticle and second wafer surface temperature data obtained by performing exposure on the wafer using a second reticle.

17. The method as claimed in claim 16, wherein
the first wavelength is 193 nm, and
the second wavelength is in a UV wavelength band.

18. The method as claimed in claim 16, wherein the applying the exposure light and the applying the heating light are performed at the same time.

19. The method as claimed in claim 16, wherein controlling the dose of heating light includes controlling a light source outputting the heating light.

20. The method as claimed in claim 16, wherein controlling the dose of heating light includes controlling an optical filter between the heating light and the exposure area.

* * * * *